(12) United States Patent
Huang et al.

(10) Patent No.: US 12,490,561 B2
(45) Date of Patent: Dec. 2, 2025

(54) LED-BASED DEVICE

(71) Applicant: SIGNIFY HOLDING B.V., Eindhoven (NL)

(72) Inventors: Chienfu Huang, Eindhoven (NL); Xiuru Wang, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 622 days.

(21) Appl. No.: 17/796,304

(22) PCT Filed: Feb. 1, 2021

(86) PCT No.: PCT/EP2021/052317
§ 371 (c)(1),
(2) Date: Jul. 29, 2022

(87) PCT Pub. No.: WO2021/156207
PCT Pub. Date: Aug. 12, 2021

(65) Prior Publication Data
US 2023/0207758 A1    Jun. 29, 2023

(30) Foreign Application Priority Data

Feb. 7, 2020   (WO) ................ PCT/CN2020/074512
Mar. 20, 2020  (EP) .................................... 20164671

(51) Int. Cl.
*H10H 20/857*   (2025.01)
*H01L 25/075*   (2006.01)
(Continued)

(52) U.S. Cl.
CPC ....... *H10H 20/857* (2025.01); *H01L 25/0753* (2013.01); *H05B 45/3577* (2020.01); *H05B 47/19* (2020.01); *H10H 20/8312* (2025.01)

(58) Field of Classification Search
CPC ............. H10H 20/0364; H10H 20/813; H10H 20/8132; H10H 20/816; H10H 20/83;
(Continued)

(56) References Cited

U.S. PATENT DOCUMENTS

2007/0194333 A1   8/2007  Son
2014/0291708 A1*  10/2014 Zeng ................... H01L 25/0753
                                                          438/28
(Continued)

FOREIGN PATENT DOCUMENTS

CN     202281060 U    6/2012
CN     104347032 A    2/2015
(Continued)

OTHER PUBLICATIONS

Jia et al., LED Device for System Level Packaging, 2015, machine translation of CN 104733587 A, pp. 1-7. (Year: 2015).*
(Continued)

*Primary Examiner* — Natalia A Gondarenko

(57) ABSTRACT

The invention provides a light generating device (1000) comprising (i) a first series (1100) of at least two first LEDs (100), which are electrically conductively coupled, and (ii) a first support (2100) configured to support the at least two first LEDs (100), wherein: (i) the at least two first LEDs (100) comprise solid-state LEDs (10); and (ii) the at least two first LEDs (100) comprise a p-side up LED (110) and an n-side up LED (120), and wherein the at least two first LEDs (100) are configured to generate first LED light (101) having dominant wavelengths within 50 nm of each other.

14 Claims, 4 Drawing Sheets

(51) Int. Cl.
  *H05B 45/3577* (2020.01)
  *H05B 47/19* (2020.01)
  *H10H 20/831* (2025.01)
(58) Field of Classification Search
  CPC ............... H10H 20/8314; H10H 20/85; H10H
        20/8504; H10H 20/8505; H10H 20/8508;
        H10H 20/857; H10H 20/8312; H10H
        29/036; H10H 29/0364; H10H 29/10;
        H10H 29/14; H10H 29/20; H10H 29/24;
        H10H 29/832; H10H 29/85; H10H
        29/8508; H10H 29/8514; H10H 29/857;
        H10H 29/8585; H10H 29/942; H10H
        29/922; H01L 25/0753; H01L 25/167;
        H01L 33/36; H01L 33/38; H01L 33/385;
        H01L 33/387; H01L 33/42; H01L 33/50;
        H01L 33/502; H01L 33/505; H01L
        33/507; H01L 33/58; H01L 33/60; H01L
        33/62; H01L 27/1255; H01L 27/1214;
        H01L 27/124; H01L 27/1251; H01L
        27/156; H01L 27/32; H01L 27/322; H01L
        27/3237; H01L 27/3244; H01L 27/3248;
        H01L 27/3246; H01L 27/3255; H01L
        27/326; H01L 27/3265; H01L 27/3272;
        H01L 27/3276; H01L 27/3293; H01L
        25/075; H01L 25/105; H01L 25/115;
        G09F 9/33; H05B 45/3577; H05B 47/19;
                          H05B 47/196
  USPC .......................................................... 257/72
  See application file for complete search history.

(56) References Cited

U.S. PATENT DOCUMENTS

2015/0357372 A1* 12/2015 van de Ven ......... H01L 25/0753
                                                    257/89
2019/0165231 A1*  5/2019 Doan .................. H01L 25/0753

FOREIGN PATENT DOCUMENTS

| CN | 104733587 A | * | 6/2015 | ............ H10H 20/85 |
|----|-------------|---|--------|------------------------|
| CN | 108122899 A |   | 6/2018 |                        |
| JP | S57163757 U |   | 10/1982|                        |
| JP | S6292488 A  |   | 4/1987 |                        |
| KR | 100581147 B1|   | 5/2006 |                        |
| KR | 101616230 B1|   | 4/2016 |                        |
| WO | 2013153938 A1|  | 10/2013|                        |
| WO | WO-2018149723 A1 | * | 8/2018 | ........... H10H 20/858 |

OTHER PUBLICATIONS

Groetsch et al., Optoelectronic Lighting Device, and Method for Operating Anoptoelectronic Lighting Device, 2018, machine translation of WO 2018149723 A1, pp. 1-10. (Year: 2018).*

* cited by examiner

LED-BASED DEVICE

CROSS-REFERENCE TO PRIOR APPLICATIONS

This application is the U.S. National Phase application under 35 U.S.C. § 371 of International Application No. PCT/EP2021/052317, filed on Feb. 1, 2021, which claims the benefit of Chinese Patent Application No. PCT/CN2020/074512, filed on Feb. 7, 2020, which claims the benefit of European Patent Application No. 20164671.8, filed on Mar. 20, 2020. These applications are hereby incorporated by reference herein.

FIELD OF THE INVENTION

The invention relates to a light generating device and to a light generating system comprising such light generating device.

BACKGROUND OF THE INVENTION

LED-based devices are known in the art. US2007/0194333, for instance, describes a light emitting diode package comprising a package main body with a cavity; a plurality of light emitting diode chips mounted in the cavity; a wire connected to an electrode of at least one light emitting diode chip; and a plurality of lead frames formed in the package main body, wherein at least one lead frame is electrically connected to the light emitting diode chip or a plurality of wires. The plurality of light emitting diode chips include a horizontal light emitting diode chip with two electrodes disposed in a horizontal structure, and/or a vertical light emitting diode chip with electrodes disposed in a vertical structure. At least one of the light emitting diode chips includes a P electrode or an N electrode die-bonded to the lead frame.

JP S 62 92488 A discloses a light emitting display with a light emitting diode chip. The light emitting display body composed of a light emitting diode chip, which is connected to a first conductive pattern formed on the back surface of the display body substrate via a through hole, and a conductive portion formed on the front surface of the display body substrate and a display. The light emitting portion base is formed by a part of the second conductive pattern insulated and separated from the conductive portion formed on the surface of the body substrate, and the conductive portion forming the light emitting portion base and the second conductive portion. A light emitting diode chip having a complementary relationship with each other is provided as a pair with each of a part of the conductive pattern, and the different polar upper surfaces of both of these light emitting diode chips are bridged and connected by a bonding wire to each of the light emitting parts. A light emitting display body using a light emitting diode chip, which comprises forming a series connection of two light emitting diode chips.

CN 108 122 899 A discloses a vertical structure chip series connection structure and a series connection method, wherein the series connection structure comprises two vertical structure chips, a prefabricated substrate and a gold wire, wherein the two vertical structure chips comprise a vertical structure chip with an upward p electrode and a vertical structure chip with an upward n electrode; downward electrodes of the two vertical structure chips are respectively welded on the prefabricated substrate, the upward electrodes are connected by welding the gold wire, and the series connection of the vertical structure chips is realized. Therefore, the vertical structure chips are not connected through routing in the process of series connection, and the reliability is improved while the cost is greatly lowered.

SUMMARY OF THE INVENTION

It appears that there is a desired to provide light generating devices based on LEDs which may be operated at higher voltages than e.g. about 3 V for the blue and/or green LEDs and 2 V for the red LED. There appears a desire to provide light generating devices with an improved electrical design. Further, there appears to be a desire to provide compact light generating devices based on LEDs, especially in a relatively simple way. Further, there is a desire for relatively efficient solutions for light generating devices based on LEDs. Hence, it is an aspect of the invention to provide an alternative light generating device (and/or system comprising such device), which preferably further at least partly obviates one or more of above-described drawbacks. The present invention may have as object to overcome or ameliorate at least one of the disadvantages of the prior art, or to provide a useful alternative.

In a first aspect, the invention provides a light generating device ("device" or "lighting device") comprising (i) a first series of at least two first LEDs, which are electrically conductively coupled. Further, the device may comprise (ii) a first support configured to support the at least two first LEDs. In specific embodiments, the at least two first LEDs comprise solid-state LEDs. Further, in specific embodiments the at least two first LEDs comprise a p-side up LED and an n-side up LED. In specific embodiments, the at least two LEDs are configured to generate essentially the same light, i.e. light having essentially the same spectral power distribution. In specific embodiments, the at least two first LEDs are configured to generate first LED light having dominant wavelengths within 50 nm of each other, such as within about 40 nm of each other. Therefore, especially the invention provides in embodiments a light generating device comprising (i) a first series of at least two first LEDs, which are electrically conductively coupled, and (ii) a first support configured to support the at least two first LEDs, wherein: (a) the at least two first LEDs comprise solid-state LEDs; and (b) the at least two first LEDs comprise a p-side up LED and an n-side up LED.

With such device, it is possible to provide a compact lighting solution. Further, it appears possible to drive longer wavelength LEDs, such as red LEDs, at higher voltages. With the present invention, it is also possible to provide a color tunable lighting device that may be relatively compact.

Especially, in specific embodiments the at least two first LEDs are configured to generate first LED light having dominant wavelengths within 50 nm of each other, such as within about 40 nm, like especially within about 30 nm. This may provide first light sources which may provide first light having essentially the same color point (even more especially essentially the same spectral power distribution).

Alternatively or additionally, in specific embodiments color points differ at maximum 0.3 for u' and/or at maximum 0.3 for v', such as at maximum 0.25 for u' and/or at maximum 0.25 for v', like at maximum 0.2 for u' and/or at maximum 0.2 for v'. Especially, for at least one of u' and v', the difference in the color points is at maximum 0.1. This may provide first light sources which may provide first light having essentially the same color point.

As indicated above, the light generating device comprises a first series of at least two first LEDs, which are electrically conductively coupled. Especially, the at least two first LEDs are configured in series. When there are more than two first LEDs, two or more first LEDs may be configured parallel, though at least two LEDs are (also) configured in series. In specific embodiments, the light generating device may comprise a plurality of first series of each (at least) two first LEDs. Hence, the term "first series" may also refer to a plurality of first series. When there is more than one first series, the plurality of first series may be configured all in series. However, in (yet other) embodiments two or more first series may be configured parallel. Further, in specific embodiments wherein there are two or more first series, all first LEDs may be controlled as group. However, in other specific embodiments wherein there are two or more first series, two or more first series of the two or more first series may be controlled individually.

The term "electrically conductively coupled" especially refers to embodiments wherein a p electrode of one of the first LEDs in the first series is electrically conductively coupled to an n electrode of another one of the first LEDs in (the same) first series, or to embodiments wherein an n electrode of one of the first LEDs in the first series is electrically conductively coupled to a p electrode of another one of the first LEDs in (the same) first series. As will be further elucidated below, this electrically conductive coupling may in embodiments be provided by the first support.

Especially, the at least two first LEDs comprise solid-state LEDs. The first LEDs are especially configured to provide essentially first LED light. The first LED light may essentially be based due to electron-hole recombination by which a photon may be generated. Hence, the first LED may especially not comprise a luminescent material. Further embodiments of the first LED are described below. The presence of the at least two first LEDs does not exclude the availability of further LEDs, which may be of different types (see also further below).

As indicated above, the light generating device further comprises a first support configured to support the at least two first LEDs. In embodiments, the support may comprise or may be comprised by a PCB ("printed circuit board" or "board"). As known in the art, a printed circuit board may mechanically support and electrically connect electronic components or electrical components using conductive tracks, pads and other features etched from one or more sheet layers of copper laminated onto and/or between sheet layers of a non-conductive substrate (shortly indicated as "track" or "conductive track"). Hence, in embodiments a PCB may comprise an insulating layer arranged between a substrate and a conductive layer. An (electronic) component, such as a solid stage light source, may generally be soldered onto the PCB to both electrically connect and mechanically fasten it to the PCB. For instance, a basic PCB may consist of a flat sheet of insulating material and a layer of copper foil, laminated to the substrate. Chemical etching divides the copper into separate conducting lines called tracks or circuit traces, pads for connections, vias to pass connections between layers of copper, and features such as solid conductive areas for EM shielding or other purposes. The tracks function as wires fixed in place, and are insulated from each other by air and the board substrate material. The surface of a PCB may have a coating that protects the copper from corrosion and reduces the chances of solder shorts between traces or undesired electrical contact with stray bare wires. For its function in helping to prevent solder shorts, the coating is called solder resist. the shape of a PCB may in general be plate-like. In specific embodiments, the board may comprise a printed circuit board. Especially, the board may comprise one or more of a CEM-1 PCE, a CEM-3 PCE, a FR-1 PCE, a FR-2 PCB, a FR-3 PCB, a FR-4 PCB, and aluminum metal core PCB, especially one or more of a CEM-1 PCB, a CEM-3 PCB, a FR-1 PCB, and a FR4 PCB and an aluminum metal core PCB, more especially one or more of a CEM-1 PCB, a CEM-3 PCB, a FR-1 PCB. In specific embodiments, the printed circuit may be flexible. In yet other embodiments, the printed circuit board may be rigid.

In embodiments, the at least two first LEDs comprise a p-side up LED and an n-side up LED. Instead of the term "n-side up LED" also the term "p-side down LED" may be applied. Likewise, of the term "p-side up LED" also the term "n-side down LED" may be applied. Herein further, especially the terms "p-side up LED" and "p-side up" and "n-side up LED" and "n-side up", respectively, are used. These terms and such LEDs are known in the art. It is for instance referred to EP0350242A2, Th. Gessmann et al., J. Appl. Vol. 94 no. 5, p 2203-2216, Chen-Fu Chu et al, Jpn. J. Appl. Phys. Vol. 42 pp. L 147-L 150, which are herein incorporated by reference. Sometimes, p-side up is also indicated as "epi-up" and p-side down as "epi-down". Further, "p-side down" or "epi-down" may also be indicated as "flip chip".

As indicated above, the at least two first LEDs are "electrically conductively coupled". As in embodiments the at least two first LEDs comprise a p-side up LED and an n-side up LED, in embodiments the n-electrode of the p-side up and the p-electrode of the n-side up may be electrically conductively coupled via an electrical conductor, such as comprised by the first support. Such first support may comprise an electrical conductor, such as an electrically conductive track, which may be used to electrically conductively couple (e.g.) the n-electrode of the p-side up and the p-electrode of the n-side up. This allows a relatively compact arrangement and/or may allow a relatively easy processing.

As indicated also above, the at least two first LEDs comprise a p-side up LED and an n-side up LED. In this context, the phrase "first series of at least two first LEDs" may also refer to e.g. a first series comprise n sets of each a p-side up LED and an n-side up LED, like in specific embodiments a series of two p-side up LEDs and two n-side up LEDs. Here, n refers to a natural number of 1 or larger, such as n=2 (see further also below). Especially, the n sets of each a p-side up LED and an n-side up LED are configured as serial configuration of $(n\text{-side up}+p\text{-side up})_n$. Herein, in general "n-side up+p-side up" is the same as "p-side up+n-side up".

As can amongst others be derived from the above cited documents, in embodiments the p-side up LED and an n-side up LED may (each) be obtainable by a combination of front-side processing and back-side processing of epitaxially grown layers. In specific embodiments, the n-side up LED is obtainable by a combination of front-side processing and back-side processing of epitaxially grown layers. Alternatively or additionally, in embodiments the p-side up LED is obtainable by front-side processing only of epitaxial grown layers. However, especially the p-side up LED may be obtainable by a combination of front-side processing and back-side processing of epitaxially grown layers. Hence, in embodiments the n-up LED may be obtainable by a one-time flip of the substrate. The p-up LED may in embodiments be obtainable by a two-times flip of the substrate.

Especially, in embodiments the at least two first LEDs may provide first LED light that is essentially the same. Hence, the first LED light of one of the at least two first LEDs may essentially be the same as the first LED light of another one of the at least two first LEDs. When there are more than two first LEDs in the first series, in embodiments all first LEDs in the first series may provide essentially the same light.

Here, the term "essentially the same light", and similar terms, may refer to embodiments wherein the first LED light of the first LEDs may have dominant wavelengths within about 50 nm, such as within about 40 nm, such as especially within about 30 nm. Therefore, in specific embodiments the at least two first LEDs are configured to generate first LED light having dominant wavelengths within 40 nm of each other. Especially, the first LED light of the first LEDs may have dominant wavelengths within about 20 nm. The term "dominant wavelength" is known in the art. The term "dominant wavelength" may refer to the wavelength of the monochromatic stimulus that, when additively mixed in suitable proportions with the specified achromatic stimulus, matches the color stimulus considered.

Here, the term "essentially the same light", and similar terms, may alternatively or additionally (in specific embodiments) also indicate that the respective color points differ at maximum 0.03 for u' and/or at maximum 0.03 for v'. Here, u' and v' are color coordinate of the light in the CIE 1976 UCS (uniform chromaticity scale) diagram.

Hence, the first LEDs, even though being different in the sense that one may be p-up and the other may be n-up, the active layers may essentially be the same such that the light generated by the different first LEDs may be essentially the same. The (shape of the) spectral power distributions may in embodiments thus be essentially the same.

The above described device, comprising (i) a first series of at least two first LEDs, which are electrically conductively coupled, and (ii) a first support configured to support the at least two first LEDs, wherein: (a) the at least two first LEDs comprise solid-state LEDs; and (b) the at least two first LEDs comprise a p-side up LED and an n-side up LED, and wherein in specific embodiments the at least two first LEDs are configured to generate first LED light having dominant wavelengths within 50 nm of each other, may especially be able to generate light ("device light") when a voltage is applied over the series.

Hence, in specific embodiments the device may further comprise an electrical power source. Especially, the electrical power source is configured to apply a voltage difference over the first series of the at least two first LEDs (during an operational mode of the device). Further, especially the voltage may be controllable. To this end, the device may further comprise a control system, which may especially be configured to control the voltage over the first series. Hence, in specific embodiments (of the light generating device), the device may further comprise an electrical power source and a control system, wherein the electrical power source and the control system are configured to apply a controllable voltage difference over the first series of the at least two first LEDs. Note that in embodiments the electrical power source and the control system may be an integrated system.

In specific embodiments, in an operational mode of the device the electrical power source and the control system are configured to apply (in an operational mode) a voltage difference selected from the range of 4-12 V over the first series of the at least two first LEDs, especially selected from the range of 5-10 V, even more especially selected from the range of 6-9 V, such as 6 V or 9 V. For instance, this may be the voltage at maximum power when the first series comprises a (single) p-side up LED and a (single) n-side up LED. Would there two first series of each a p-side up and an n-side up be configured in series, i.e. two p-side up LEDs and two n-side up LEDs, the voltage thereover may especially be selected from the range of 8-12 V. Note that the phrase "two first series of each a p-side up LED and an n-side up LED be configured in series" may also be indicated as a first series comprising two p-side up LEDs and two n-side up LEDs. Hence, in specific embodiments the voltages over the first series may be selected from the range of 4-12 V. Therefore, in specific embodiments the first series comprises either (a) a single p-side up LED and a single n-side up LED (which may in embodiments be driven with a voltage selected from the range of 4-9 V), or (b) the first series comprises two p-side up LEDs and two n-side up LEDs (which may in embodiments be driven with a voltage selected from the range of 8-12 V).

Further, especially series with single blue or single green LEDs may be driven at a voltage selected from the range of 6-9 V, such as e.g. 6 V or 9 V.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

In specific embodiments, the solid-state LEDs comprise AlGaInP based LEDs. Hence, the first LEDs of the first series may all be AlGaInP based LEDs. For instance, Th. Gessmann et al. (see also above), described such LEDs.

In specific embodiments, the at least two first LEDs comprise omni-directional reflectors ("ODR"). ODRs are describe in amongst others Jong Kyu Kim et al., "Omni-direction reflectors for light-emitting diodes", in "Light-Emitting Diodes: Research, Manufacturing, and Applications X, ed. Klaus P. Streubel et al. Proc. of SPIE Vol. 6134, 61340D, and also in Th. Gessmann et al., which are herein incorporated by reference.

AlGaInP based LEDs may be most efficient above about 590 nm, but may be able to emit at wavelengths down to about 550 nm (but at lower efficiencies than above about 590 nm), or even down to about 520 nm. Further, AlGaInP based LEDs may be able to emit at wavelengths up to about 650 nm. Therefore in specific embodiments the AlGaInP based LEDs are (each) configured to generate first light having a wavelength selected from the range of 520-650 nm. Hence, in embodiments the solid-state LEDs are configured to generate red LED light. Alternatively, in embodiments the solid-state LEDs are configured to generate green LED light. Other colors, such as yellow or orange may also be possible. Hence, alternatively in embodiments the solid-state LEDs are configured to generate yellow LED light or orange LED light. Further, note that in specific embodiments there may be more than one (first) series, wherein LEDs in different series may be configured to provide different colors, respectively. The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component.

Hence, especially the first LEDs may be configured to generate visible light. Even more especially, the first LEDs may be configured to generate visible light having a wavelength selected from the range of 520-650 nm (see also above), such as having a dominant wavelength within this range. Would in embodiments further LEDs be available (see also below), in specific embodiments such further LEDs may also be configured to generate visible light. The terms "visible", "visible light" or "visible emission" and similar terms refer to light having one or more wavelengths in the range of about 380-780 nm.

With the above defined first series of at least two LEDs it may in embodiments be possible to provide device light with an essentially non-tunable spectral power distribution. Would that be desirable, a plurality of individually controllable first series should be applied. Alternatively, another series of one or more light sources, especially solid states light sources may be applied. Such further series of one or more solid state light sources, be it similar type of solid state light sources as the first series, or other type of solid state light sources are herein indicated as second series, third series, etc. Here below, some embodiments in relation to a second series and a second series and a third series are further elucidated. However, more than three different series may in embodiments also be possible. Hence, in specific embodiments the term "third" may refer to third and one or more further.

Hence, in specific embodiments the light generating device may further comprising (i) a second series of one or more second LEDs. Such second series may comprise one or more second LEDs. Such one or more LEDs may be of the same type as described above, and may provide LED light having essentially the same spectral power distribution as of the first LEDs. Hence, in (very) specific embodiments the second series at least two second LEDs comprise a p-side up LED and an n-side up LED, in embodiments the n-electrode of the p-side up and the p-electrode of the n-side up may be electrically conductively coupled via an electrical conductor, such as comprised by a second support (see also above). Especially, however, in embodiments the second LEDs are configured to provide second LED light having a spectral power distribution different from the first LED light. Hence, especially in embodiments the at least two first LEDs and the one or more second LEDs are configured to generate first LED light and second LED light, respectively, having different colors.

As can be derived from the above, the term "different colors" may especially imply in embodiments that that the respective color points differ at least about 50 nm. Hence, the wavelengths of the dominant wavelengths may differ at least about 50 nm.

As can be derived from the above, the term "different colors" may especially imply in embodiments that that the respective color points differ at least 0.03 for u' and/or at least 0.03 for v', such as at least 0.04 for u' and/or at least 0.04 for v', like especially at least 0.05 for u' and/or at least 0.05 for v'.

Hence, with respect to the second LED or second LEDs the same embodiments as described in relation to the first LEDs may apply, though especially there is a difference in spectral power distribution, more especially in the color of the first LED light and the second LED light. Hence, in specific embodiments there are at least two second LEDs which are "electrically conductively coupled". In yet further specific embodiments the at least two second LEDs comprise a p-side up LED and an n-side up LED, wherein in yet further specific embodiments the n-electrode of the p-side up and the p-electrode of the n-side up may be electrically conductively coupled via an electrical conductor, such as comprised by a second support.

The one or more second LEDs may be supported by a second support, which may be comprised by a larger support also comprising the first support (see also below). Such second support may comprise an electrical conductor, such as an electrically conductive track, which may be used to electrically conductively couple two or more second LEDs, such as in specific embodiments the n-electrode of the p-side up and the p-electrode of the n-side up. This allows a relatively compact arrangement and/or may allow a relatively easy processing. Note, however, that the second series may also comprise a single second LED. As indicated above, the light generating device may further comprise a second support configured to support the one or more second LEDs. Therefore, in specific embodiments the light generating device may further comprise (i) a second series of one or more second LEDs, and (ii) a second support configured to support the one or more second LEDs, wherein the at least two first LEDs and the one or more second LEDs are configured to generate first LED light and second LED light, respectively, having different colors (such as having color points that differ at least 0.03 for u' and/or at least 0.03 for v').

In specific embodiments, the light generating device is configured to generate device light comprising one or more of the first LED light and the second LED light, wherein the light generating device further comprises the electrical power source and the control system as defined herein, wherein the electrical power source and the control system are configured to apply a controllable first voltage difference over the first series of the at least two first LEDs and a controllable second voltage difference over the second series of the one or more second LEDs. In specific embodiments, in an operational mode the device light is white device light (see further also below).

Especially, the one or more second LEDs are solid state light sources. As indicated above, in specific embodiments the one or more second LEDs may be AlGaInP based LEDs.

In specific embodiments the light generating device may further comprising (i) a third series of one or more third LEDs. Such third series may comprise one or more third LEDs. Such one or more LEDs may be of the same type as described above (in relation to the first LEDs (and optionally the second LEDs), and may provide LED light having essentially the same spectral power distribution as of the first LEDs. Hence, in (very) specific embodiments the third series comprising at least two third LEDs may comprise a p-side up LED and an n-side up LED, in embodiments the n-electrode of the p-side up and the p-electrode of the n-side up may be electrically conductively coupled via an electrical conductor, such as comprised by a third support (see further also below). Especially, however, in embodiments the third LEDs are configured to provide third LED light having a spectral power distribution different from the first LED light (and from the second LED light). Hence, especially in embodiments the at least two first LEDs, the second LEDs, and the one or more third LEDs are configured to generate first LED light, second LED light, and third LED light, respectively, having different colors.

As can be derived from the above, the term "different colors" may especially imply in embodiments that that the respective color points differ at least about 50 nm. Hence, the wavelengths of the dominant wavelengths may differ at least about 50 nm.

As indicated above, the term "different colors" may especially imply that that the respective color points differ at least 0.03 for u' and/or at least 0.03 for v', such as at least 0.04 for u' and/or at least 0.04 for v', like especially at least 0.05 for u' and/or at least 0.05 for v'.

Hence, with respect to the third LED or third LEDs the same embodiments as described in relation to the first LEDs and optionally the second LEDs) may apply, though especially there is a difference in spectral power distribution, more especially in the color of the first LED light, the second LED light, and the third LED light. Hence, in specific embodiments there are at least two third LEDs which are "electrically conductively coupled". In yet further specific embodiments the at least two third LEDs comprise a p-side up LED and an n-side up LED, wherein in yet further specific embodiments the n-electrode of the p-side up and the p-electrode of the n-side up may be electrically conductively coupled via an electrical conductor, such as comprised by a third support.

The first LEDs may (essentially) be solid state LEDs. Hence, the first LED light may (essentially) be the first light. Likewise, the second LEDs may (essentially) be solid state LEDs. Hence, the second LED light may (essentially) be the second light. Likewise, the third LEDs may (essentially) be solid state LEDs. Hence, the third LED light may (essentially) be the third light.

The one or more third LEDs may be supported by a third support, which may be comprised by a larger support also comprising the first support and the second (see also below). Such third support may comprise an electrical conductor, such as an electrically conductive track, which may be used to electrically conductively couple two or more third LEDs, such as in specific embodiments the n-electrode of the p-side up and the p-electrode of the n-side up. This allows a relatively compact arrangement and/or may allow a relatively easy processing. Note, however, that the third series may also comprise a single third LED. Hence, in embodiments the light generating device may further comprising (i) a third series of one or more third LEDs, and (ii) a third support configured to support the one or more third LEDs, wherein the at least two first LEDs, the one or more second LEDs, and the one or more third LEDs are configured to generate first LED light, second LED light, and third light, respectively, having different colors (such as having color points that differ at least 0.03 for u' and/or at least 0.03 for v').

In specific embodiments, the light generating device comprising (i) a first series of at least two first LEDs, which are electrically conductively coupled, and (ii) a first support configured to support the at least two first LEDs, wherein:
  the at least two first LEDs comprise solid-state LEDs configured to generate red LED light; and
  the at least two first LEDs comprise a p-side up LED and an n-side up LED, and wherein the at least two first LEDs are configured to generate first LED light having dominant wavelengths within 50 nm of each other;
  the light generating device further comprising (i) a second series of one or more second LEDs, and (ii) a second support configured to support the one or more second LEDs, wherein:
  the at least two first LEDs and the one or more second LEDs are configured to generate first LED light and second LED light, respectively, having different colors; and the light generating device further comprising (i) a third series of one or more third LEDs, and (ii) a third support configured to support the one or more third LEDs, wherein:

the at least two first LEDs, the one or more second LEDs, and the one or more third LEDs are configured to generate first LED light, second LED light, and third LED light, respectively, having different colors.

The obtained effect is an improved light generating device (e.g. a RGB LED package) having an improved electrical design and/or compact shape. The light generating device providing red light and other colors has an improved electrical design while being compact. The voltage (V) and/or current (I) characteristics (obtained by the particular configuration) of the first series of at least two first LEDs are better matched with the second series of one or more second LEDs and third series of one or more third LEDs.

Especially, the one or more third LEDs are solid state light sources.

In yet further specific embodiments, the light generating device is configured to generate device light comprising one or more of the first LED light, the second LED light, and the (optional) third LED light as defined herein, wherein the light generating device further comprises the electrical power source and the control system as defined herein, wherein the electrical power source and the control system are configured to apply a controllable first voltage difference over the first series of the at least two first LEDs, a controllable second voltage difference over the second series of the one or more second LEDs, and a controllable third voltage difference over the (optional) third series of the one or more third LEDs. In yet more specific embodiments, in an operational mode the device light is white device light.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

As indicated above, the light generating device may comprise a (main) support, wherein the (main) support comprises the first support, the second support, and the optional third support. Such (main) support may comprise a PCB. See further above for embodiments of the PCB. Hence, in embodiments the first support, the second support, and the optional third support may be parts of a (main support). Especially, in embodiments the first support, the second support, and the optional third support are enclosed by the same housing.

In specific embodiments, the light generating device comprises the (main) support, which (is configured) to support (I) the first series comprises either (a) a single p-side up LED and a single n-side up LED (which may in embodiments be driven with a voltage selected from the range of 4-9 V), or (b) the first series comprises two p-side up LEDs and two n-side up LEDs (which may in embodiments be driven with a voltage selected from the range of 8-12 V); (II) the second series of one or more second LEDs, especially the second series comprising a single LED; and (III) the third series of one or more third LEDs, especially the third series comprising a single LED. Optionally, further series may be available. Especially, the LEDs of the respective series are configured to generate LED light that differs, like e.g. RGB. For instance, the first series may be configured to generate red light, the second series may be configured to generate green light and the third series may be configured to generate blue light. In this way a gamut of color points (of the device light) may be obtainable.

In specific embodiments, the light generating device comprises the (main) support, which (is configured) to support (I) the first series comprises either (a) a single p-side up LED and a single n-side up LED (which may in embodiments be driven with a voltage selected from the range of 4-9 V), or (b) the first series comprises two p-side up LEDs and two n-side up LEDs (which may in embodiments be driven with a voltage selected from the range of 8-12 V); and (II) the second series of one or more second LEDs, especially the second series comprising a single LED. Optionally, further series may be available. Especially, the LEDs of the respective series are configured to generate LED light that differs, like e.g. in embodiments whitish light (such as white light having a high color temperature; or off-white with a relatively high contribution of green and/or blue, especially both) from the second series, and red light (from the first series). For instance, the first series may be configured to generate red light, the second series may be configured to generate white or whitish light. In this way, e.g. the color temperature (of the device light) may be controlled.

In specific embodiments, in an operational mode the control system is configured to control the correlated color temperature of the device light while maintaining a constant flux of the device light. Such operational mode may also be indicated with the reference "M2". Alternatively or additionally, in an(other) operational mode the control system is configured to control the correlated color temperature of the device light while maintaining a maximum flux of the device light. Such operational mode may also be indicated with the reference "M1".

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, etc. In embodiments, the light generating device may be a T-LED or a downlight luminaire. In yet other embodiments, the light generating device may be comprised by a T-LED or a downlight luminaire.

In yet a further aspect, the invention provides a light generating system comprising the light generating device as defined herein and a communication system for a wireless control of the control system. For instance, the communication system may be comprised by the light generating device as defined above. However, in embodiments the communication system may also be external of one or more, especially a plurality, of the light generating devices comprised by the system. The communication system may be a master slave system with an external master communication system, and with each light generating device comprising a slave communication system. Likewise, the control system may be a master-slave system with an external master control system, and with each light generating device comprising a slave control system. Further, the communication system may be comprised by the control system or may be functionally coupled to the control system. The control system may e.g. comprise a "bridge" or Wi-Fi router, etc. Hence, in specific embodiments the light generating device is comprised by a connected lighting system. Hence, the light generating system may comprise two or more light generating devices which are connected. For instance, communication between light generating devices may be via Bluetooth, WIFI, LiFi, ZigBee, BLE or WiMAX, or another wireless technology.

The phrases "different light sources" or "a plurality of different light sources", and similar phrases, may in embodiments refer to a plurality of solid state light sources selected from at least two different bins. Likewise, the phrases "identical light sources" or "a plurality of same light sources", and similar phrases, may in embodiments refer to a plurality of solid state light sources selected from the same bin.

In alternative embodiments, the dominant wavelengths of two first light sources of the at least two first light sources of the first series may differ with a value selected from the range of 0-130 nm (i.e. they may not differ or may differ with up to 130 nm), such as selected from the range of 0-50 nm, like 0-40 nm.

In specific embodiments, the light generating device comprising: (i) more first LEDs than second LEDs, and more first LEDs than third LEDs.

In specific embodiments, the light generating device comprising N second LEDs and M third LEDs, wherein N=M.

In specific embodiments, the light generating device comprising N second LEDs and M third LEDs, and the light generating device comprising Z first LEDs, wherein the ratio Z:N:M=2:1:1. For example, the lighting device may comprise 2 first LEDs, 1 second LED and 1 third LED, the lighting device may comprise 4 first LEDs (e.g. 2 p-side up LEDs and 2 n-side up LEDs), 2 second LEDs and 2 third LEDs, or the lighting device may comprise 6 first LEDs (e.g. 3 p-side up LEDs and 3 n-side up LEDs), 3 second LED and 5 third LEDs.

In specific embodiments, the first LEDs emit red LED light.

In specific embodiments, the second LEDs emit green LED light.

In specific embodiments, the third LEDs emit (orange and/or) red LED light.

In specific embodiments, the first series of at least two first LEDs emit red LED light.

In specific embodiments, the second series of one or more second LEDs emit green LED light.

In specific embodiments, the third series of one or more third LEDs emit (orange and/or) red LED light.

In specific embodiments, the second LEDs comprising a p-electrode and a n-electrode on the same side, and wherein the third LEDs comprising a p-electrode and a n-electrode on the same side. The same side may be on a top surface or on a bottom surface of the LED. Such type of LEDs are easy and low to mount and/or manufacture.

In specific embodiments, one of the following applies:
(i) the second LEDs comprising the p-electrode and the n-electrode on a top surface of the second LEDs and the third LEDs comprising the p-electrode and the n-electrode on a top surface of the third LEDs,
(ii) the second LEDs comprising the p-electrode and the n-electrode on a bottom surface of the second LEDs and the third LEDs comprising the p-electrode and the n-electrode on a bottom surface of the third LEDs.

The obtained effect of previous embodiments is a further improved light generating device (e.g. a RGB LED package). The light generating device has an improved electrical design and/or is more compact. The voltage (V) and/or current (I) characteristics of the first series of at least two first LEDs are even better matched with the second series of one or more second LEDs and third series of one or more third LEDs, thus an improved electrical design. Such configuration allows for a simple and/or low-cost design of the light generating device (e.g. an RGB LED package) and/or a allows for a simple and/or low-cost design of a controller/driver which can be used for said light generating device. Furthermore, such device is compact.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
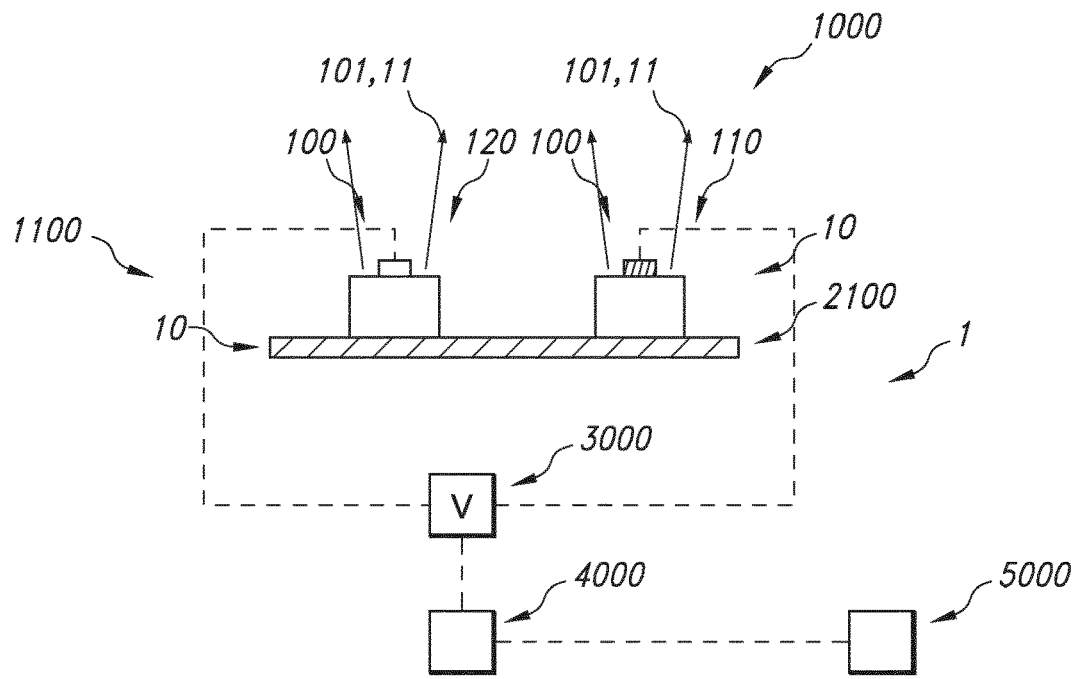
FIGS. 1a-1f schematically depict some embodiments.

FIG. 1a schematically depicts an embodiments of a light generating device 1000. The light generating device 1000 comprises a first series 1100 of at least two first LEDs 100, which are electrically conductively coupled. Further, the light generating device 1000 comprises a first support 2100 configured to support the at least two first LEDs 100.

In specific embodiments, the at least two first LEDs 100 comprise solid-state LEDs 10. Especially, the at least two first LEDs 100 comprise a p-side up LED 110 and an n-side up LED 120. Further, in specific embodiments the at least two first LEDs 100 are configured to generate first LED light 101, e.g. having dominant wavelengths within 50 nm of each other.

In embodiments, the p-side up LED 110 and an n-side up LED 120 are (both) obtainable by a combination of front-side processing and back-side processing of epitaxially grown layers. These front-side processing and back-side processing may thus differ, see further also below. In alternative embodiments, instead of the p-side up obtainable by a combination of front-side processing and back-side processing of epitaxially grown layers, normal epitaxially grown p-up LED may be chosen.

In embodiments, the solid-state LEDs 10 may comprise AlGaInP based LEDs.

Further, in specific embodiments the solid-state LEDs 10 may be configured to generate red LED light 11, or green LED light 11, or yellow LED light 11, or orange LED light 11.

As further schematically depicted, the light generating device 1000 may further comprise an electrical power source 3000 and a control system 4000. In specific embodiments, the electrical power source 3000 and the control system 4000 may be configured to apply a controllable voltage difference over the first series 1100 of the at least two first LEDs 100. Further, in specific embodiments in an operational mode of the device 1000 the electrical power source 3000 and the control system 4000 are configured to apply a voltage difference selected from the range of 4-12 V, such as 5-10 V, like 6-9 V, over the first series 1100 of the at least two first LEDs 100. This may refer to an operational mode wherein the maximum power is provided to the first series of first LEDs.

FIG. 1a in fact also schematically depicts an embodiment of a light generating system 1 comprising the light generating device 1000 according to any one of the preceding claims and a communication system 5000 for a wireless control of the control system 4000. The system may comprise a lamp including all elements. However, the system 1 may also comprise a lamp and an external control system (see also e.g. below).

Figure 1B:
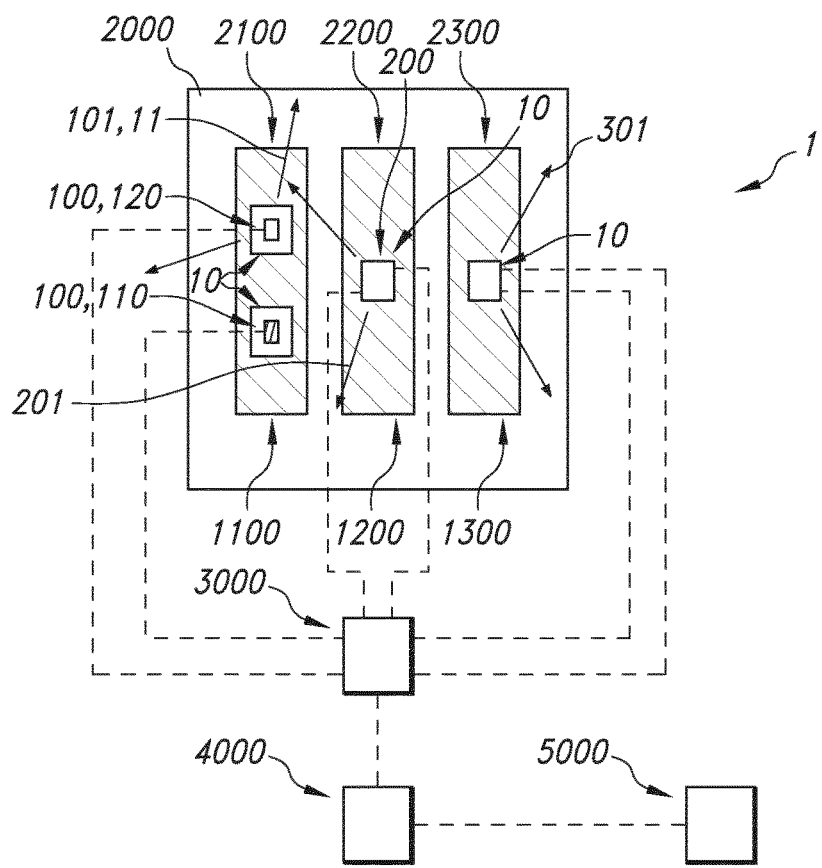
Figure 1C:
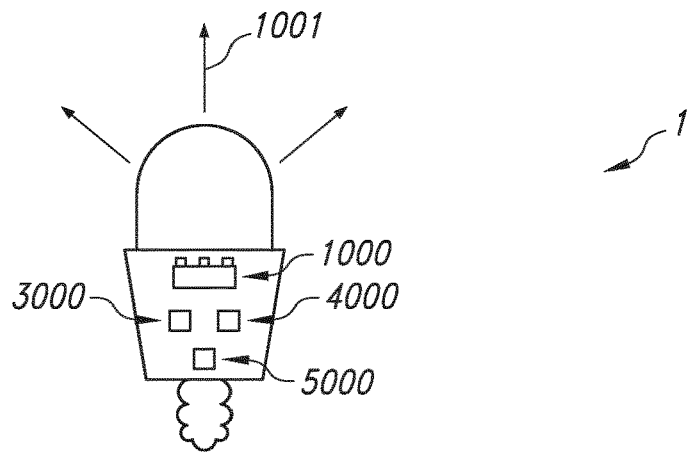

FIG. 1b schematically depicts an embodiment wherein the light generating device 1000 further comprises a second series 1200 of one or more second LEDs 200. Yet further, in embodiments the light generating device 1000 as schematically depicted (or other embodiments) may further comprise a second support 2200 configured to support the one or more second LEDs 200. Especially, the at least two first LEDs 100 and the one or more second LEDs 200 are configured to generate first LED light 101 and second LED light 201, respectively, having different colors. In FIG. 1b, also schematically an embodiments is depicted wherein the light generating device 1000 further comprises a third series 1300 of one or more third LEDs 300 and a third support 2300 configured to support the one or more third LEDs 300. Especially, the at least two first LEDs 100, the one or more second LEDs 200, and the one or more third LEDs 300 are configured to generate first LED light 101, second LED light 201, and third light 301, respectively, having different colors.

As schematically depicted, the light generating device 1000 may further comprise a support 2000, wherein the support 2000 comprises the first support 2100, the second support 2200, and the optional third support 2300.

Especially, all LEDs 100, 200, 300 are solid state LEDs, indicated with reference 10. However, these solid state LEDs may emit (solid state) light 11 at different wavelengths. The first LEDs may be solid state LEDs. Hence, the first LED light may be the first light. Likewise, the second LEDs may be solid state LEDs. Hence, the second LED light may be the second light. Likewise, the third LEDs may be solid state LEDs. Hence, the third LED light may be the third light.

As also schematically depicted in FIG. 1b, the light generating device 1000 is configured to generate device light 1001 comprising one or more of the first LED light 101, the second LED light 201, and the optional third LED light 301. The light generating device 1000 may (thus) further comprises the electrical power source 3000 and the control system 4000. In specific embodiments, the electrical power source 3000 and the control system 4000 may be configured to apply a controllable first voltage difference over the first series 1100 of the at least two first LEDs 100, a controllable second voltage difference over the second series 1200 of the one or more second LEDs 200, and a controllable third voltage difference over the optional third series 1300 of the one or more third LEDs 200. Further, in specific embodiments in an operational mode of the device 1000, the device light 1001 may be white device light 1001.

Figure 1D:
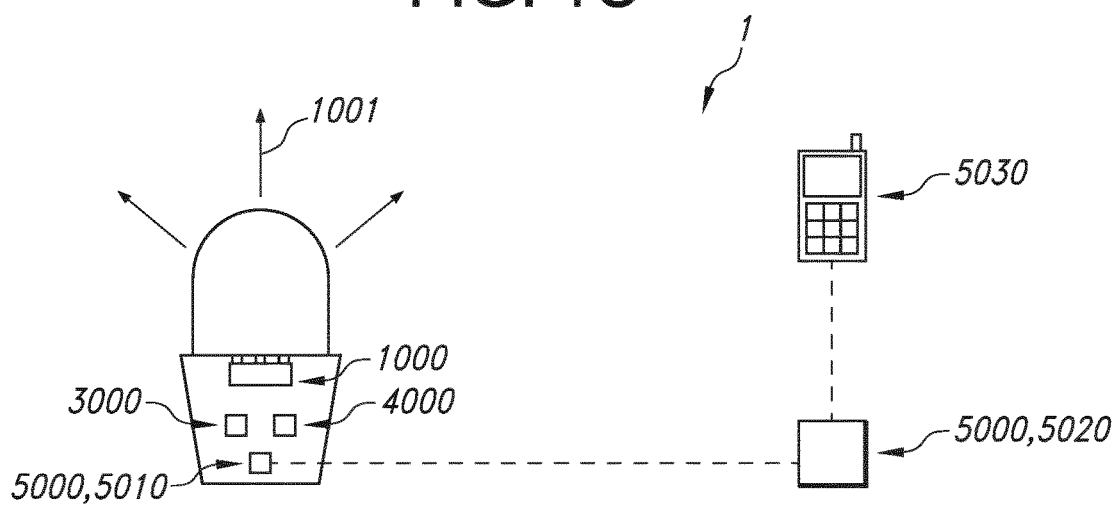
Figure 1E:
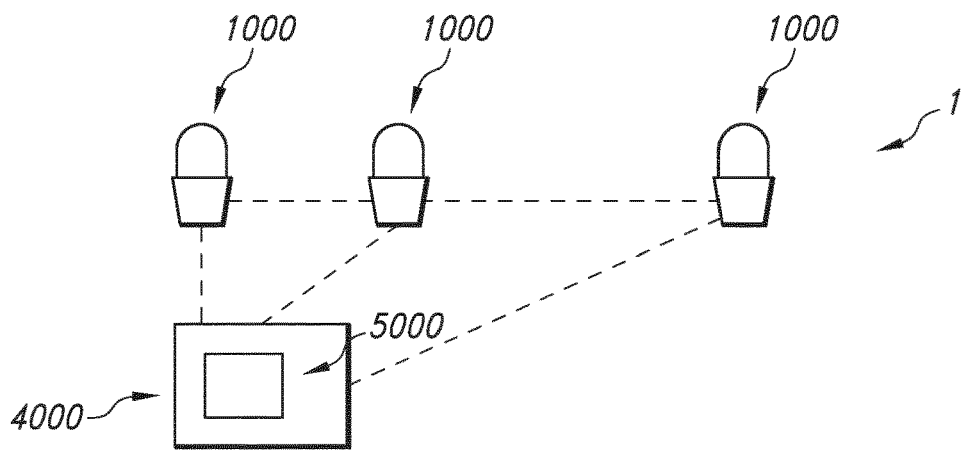

FIGS. 1d and 1e schematically depicts another embodiment of a light generating system 1 comprising the light generating device 1000 and a communication system 5000 for a wireless control of the control system 4000. Here, the light generating system 1 comprises a plurality of light generating devices and an external control system. For instance, the light generating devices 1000 may be hue devices. Further, in specific embodiments the light generating device may be able to communicate between one another. In this way a control signal may be communicated from one light generating device 1000 to another. Reference 5010 indicates a slave controller and reference 5020 a master controller. References 5030 indicates a user interface, such as a graphical user interface. For instance, such interface may be comprised by or provided by a Smartphone or I-phone or other portable (communication) device.

Figure 1F:
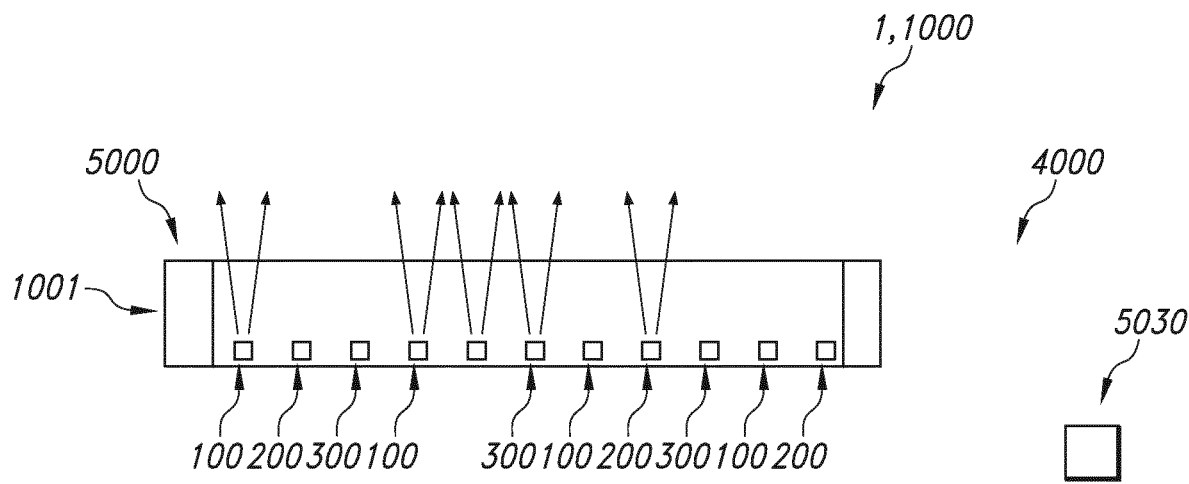

FIG. 1f schematically depicts an embodiment wherein the light generating device 1000 is selected from the group consisting of a T-LED and downlight luminaire. Here, the light generating device comprises a T-LED.

Figure 2A:
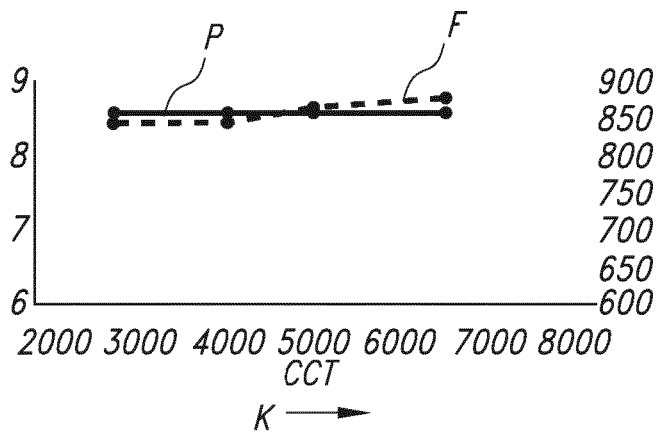
FIGS. 2a-2c schematically depict some further aspects. The schematic drawings are not necessarily to scale.
Figure 2A:
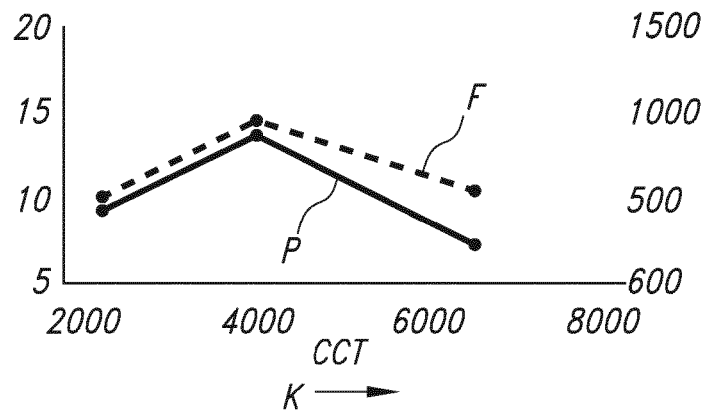

FIG. 2a schematically depicts two embodiments wherein on the x-axis the correlated color temperature (CCT) in Kelvin is indicated, and the y-axes (not indicated) represent the flux of the device light and power. Examples of flux (F) and power (P) curves are indicated, with on the left an embodiment wherein e.g. the control system may be is configured to control the correlated color temperature of the device light while maintaining a constant flux of the device light (M2 embodiment), and on the right an embodiment wherein the control system may be configured to control the correlated color temperature of the device light while maintaining a maximum flux of the device light. Such operational mode may also be indicated with the reference "M1". Other shapes of the curve on the right may of course also be possible. The curves are especially indicated to show that the dependence on the CCT is approximately the same.

With reference to Gessmann et al., the following information in relation to p-side up and n-side up LED is herein incorporated: Two fabrication routes for AlGaInP-based ODR LEDs n-type up or p-type up are shown schematically in FIGS. 2b and 2c. Both processes start out with "p-side up" epiwafers, which are the standard for epitaxial growth, and include front- and backside processing of the ODR-LED, removal of the original substrate, and bonding to a conductive carrier. The conductive carrier should ensure good heat sinking and should be thermal-expansion matched with respect to the epilayer. The p-type up process involves more steps ~due to the use of a temporary holder, but has the potential for lower contact resistances at the LED backside contact since the small-area contact pattern is applied to n-type material. The n-type up process does not require a temporary holder but the backside ohmic contacts are to p-type material, which likely results in higher contact resistances. Chemo-mechanical polishing can be employed to thin the GaAs wafer down to a thickness of about 50-100 mm. The remaining layer can then be removed by selective wet chemical etching. The wet-chemical etching step, however, requires one or more etch stop layers covering the bottom window layer of the LED to prevent etch damage. With optimized thickness, composition, and sequence of several etch stop layers the damage to the lower window layer can be minimized. The epitaxial ODR LED layer needs to be bonded to a permanent holder. Several materials are suited as holders: Si and metal substrates have high thermal conductivity when compared to GaAs or GaP and therefore provide for efficient heat sinking. However, suitable holder materials have to ensure thermal expansion matching, which is required to avoid stress damage to the LED during processing steps at elevated temperatures. The bonding process has to result in a uniform large-area bond between the substrate and the LED, which is able to sustain temperature cycling required during further LED processing such as annealing of electrical contacts. The bond may be accomplished by forming a binary intermetallic compound located between the conductive holder and the LED epilayer. For this purpose, the bonding surfaces may be covered either directly with the alloy or with the two separate components in a layer sequence with individual thicknesses ensuring the correct alloy composition. Subsequently the two surfaces are stacked face-to-face and annealed. The bonding is mediated by solid phase reactions such as solid-phase epitaxial regrowth at the alloy/epilayer and the alloy/holder interfaces. Preferably, it also involves liquid-phase reactions that help to reduce surface roughness. The bonding material should adhere to the LED epilayer as well as to the holder and should have low electrical resistance. The bonding process should take place at sufficiently low temperatures in order to avoid dopant redistribution in the heterostructure. Note that the requirements for the bonding process discussed above are less critical than for the semiconductor-to-semiconductor bonding processes used in TS technology. As an example, the AuGe intermetallic compound is capable of forming low-resistivity contacts to n-type GaAs and can therefore be employed to bond the ODR-LED epilayer to a GaAs holder. AuGe forms a eutectic phase during the bonding process at temperatures close to the melting point $T_m=360°$ C. of the eutectic. Other systems such as PdIn with a transient liquid phase have been used for bonding of GaN epilayers to Si. An alternate possibility to permanently bond the epilayer to a holder is the use of silver-loaded epoxy. The epoxy offers excellent electrical conductivity, adhesion, and bond strength. It can be easily and uniformly dispensed on the sample and is extremely reliable. However, during subsequent contact annealing the degradation temperature of the epoxy polymer $T_D \approx 400°$ C. must not be exceeded. In addition, the thermal expansion is different from GaP and therefore thermal expansion matching is difficult.

Figure 2B:
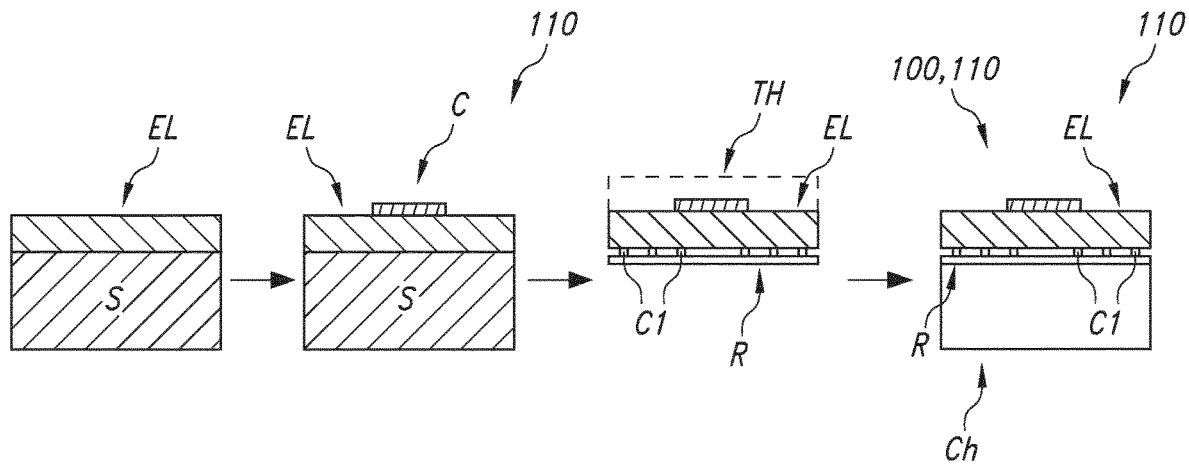
Figure 2C:
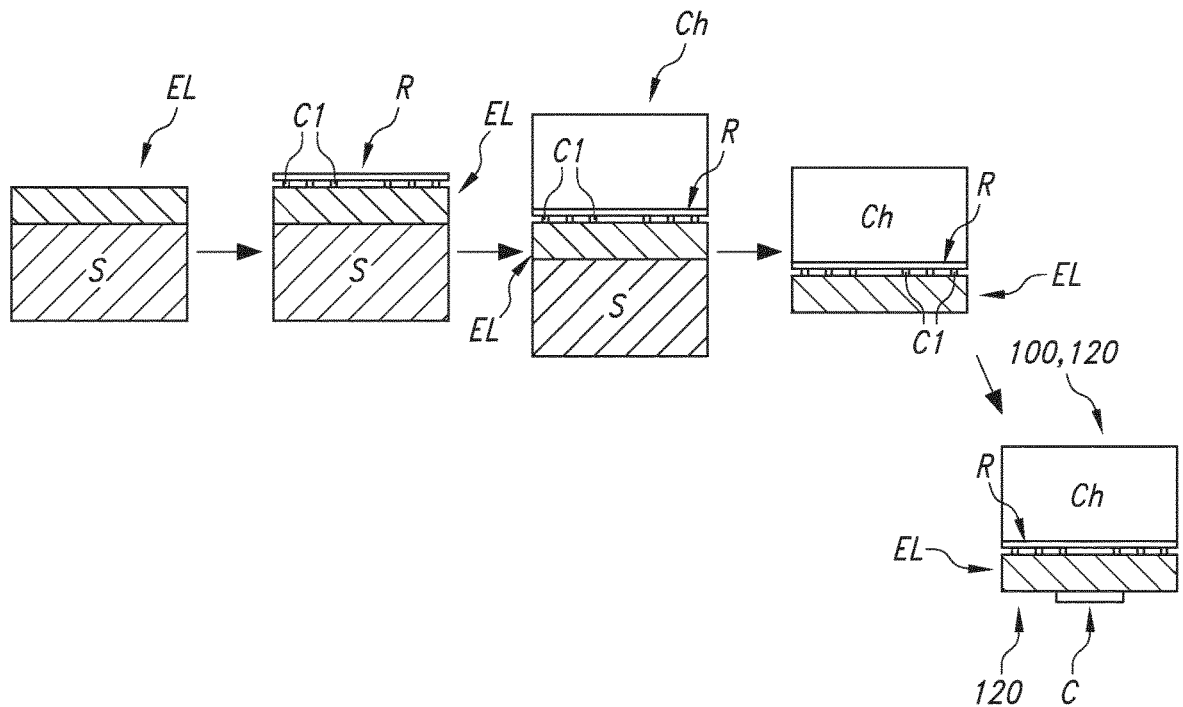

In FIGS. 2b and 2c, reference EL indicates epitaxial layers and reference S indicates a substrate. Reference C indicates a contact, in FIG. 2b a p-type contact, which is here thus p-side up configured. Reference TH indicates a temporary holder. Reference C1 are micro contacts, in FIG. 2b of the p-side up LED and in FIG. 2c of the n-side up LED. Reference R indicates the omnidirectional reflector.

Hence, FIGS. 2b and 2c also schematically depict an embodiment wherein first LED 100 comprises omni-directional reflectors.

Amongst others, it is further referred to embodiments described by Chen-Fu Chu et al., such as in FIGS. 1-2.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device comprising (i) a first series of at least two first LEDs, which are electrically conductively coupled, and (ii) a first support configured to support the at least two first LEDs, wherein:

the at least two first LEDs comprise solid-state LEDs configured to generate red LED light; and the at least two first LEDs comprise a p-side up LED and an n-side up LED, and wherein the at least two first LEDs are configured to generate first LED light having dominant wavelengths within 50 nm of each other;

the light generating device further comprising (i) a second series of one or more second LEDs, and (ii) a second support configured to support the one or more second LEDs; and the light generating device further comprising (i) a third series of one or more third LEDs, and (ii) a third support configured to support the one or more third LEDs, wherein:

the at least two first LEDs, the one or more second LEDs, and the one or more third LEDs are configured to generate first LED light, second LED light, and third LED light, respectively, having different colors; and wherein the one or more second LEDs comprising a p-electrode and a n-electrode on a same side, and wherein the one or more third LEDs comprising a p-electrode and a n-electrode on the same side.

2. The light generating device according to claim 1, wherein the p-side up LED and the n-side up LED are obtainable by a combination of front-side processing and back-side processing of epitaxially grown layers.

3. The light generating device according to claim 1, further comprising an electrical power source and a control system, wherein the electrical power source and the control system are configured to apply a controllable voltage difference over the first series of the at least two first LEDs.

4. The light generating device according to claim 3, wherein in an operational mode of the device, the electrical power source and the control system are configured to apply a voltage difference selected from the range of 4-12 V over the first series of the at least two first LEDs.

5. The light generating device according to claim 1, wherein the first series comprises either a single p-side up LED and a single n-side up LED, or wherein the first series comprises two p-side up LEDs and two n-side up LEDs.

6. The light generating device according to claim 1, wherein the light generating device comprising:
    more first LEDs than second LEDs,
    more first LEDs than third LEDs.

7. The light generating device according to claim 6, wherein the light generating device comprising N second LEDs and M third LEDs, wherein N=M.

8. The light generating device according to claim 7, wherein the light generating device comprising Z first LEDs, wherein the ratio Z:N:M=2:1:1.

9. The light generating device according to claim 1, wherein one of the following applies:
    (i) the second LEDs comprising the p-electrode and the n-electrode on a top surface of the second LEDs and the third LEDs comprising the p-electrode and the n-electrode on a top surface of the third LEDs,
    (ii) the second LEDs comprising the p-electrode and the n-electrode on a bottom surface of the second LEDs and the third LEDs comprising the p-electrode and the n-electrode on a bottom surface of the third LEDs.

10. The light generating device according to claim 1, wherein the light generating device is configured to generate device light comprising one or more of the first LED light, the second LED light, and the third LED light, wherein the light generating device further comprises an electrical power source and a control system, wherein the electrical power source and the control system are configured to apply a controllable first voltage difference over the first series of the at least two first LEDs, a controllable second voltage difference over the second series of the one or more second LEDs, and a controllable third voltage difference over the third series of the one or more third LEDs, and wherein in an operational mode the device light is white device light.

11. The light generating device according to claim 1, comprising a support, wherein the support comprises the first support, the second support, and the third support.

12. The light generating device according to claim 10, wherein in an operational mode the control system is configured to control the correlated color temperature of the device light while maintaining a constant flux of the device light.

13. A light generating system comprising the light generating device, according to claim 1 and a communication system for a wireless control of the control system.

14. The light generating device according to claim 1, wherein the light generating device is a luminaire or a lamp.

* * * * *